US012785361B2

(12) United States Patent
Qiao et al.

(10) Patent No.: US 12,785,361 B2
(45) Date of Patent: Nov. 3, 2026

(54) DYNAMIC CONTROL OF LASER TRANSVERSE MODE

(71) Applicant: APPLE INC., Cupertino, CA (US)

(72) Inventors: Pengfei Qiao, El Cerrito, CA (US); Chinhan Lin, Santa Clara, CA (US); Fei Tan, San Jose, CA (US); Alexander Hein, Munich (DE)

(73) Assignee: Apple Inc., Cupertino, CA (US)

( * ) Notice: Subject to any disclaimer, the term of this patent is extended or adjusted under 35 U.S.C. 154(b) by 706 days.

(21) Appl. No.: 18/321,016

(22) Filed: May 22, 2023

(65) Prior Publication Data

US 2024/0396301 A1 Nov. 28, 2024

(51) Int. Cl.

| | |
|---|---|
| ***H01S 5/183*** | (2006.01) |
| ***H01S 5/02325*** | (2021.01) |
| ***H01S 5/0234*** | (2021.01) |
| ***H01S 5/062*** | (2006.01) |
| ***H01S 5/10*** | (2021.01) |

(52) U.S. Cl.

CPC ...... *H01S 5/18302* (2013.01); *H01S 5/02325* (2021.01); *H01S 5/06236* (2013.01); *H01S 5/1021* (2013.01); *H01S 5/18363* (2013.01); *H01S 5/1838* (2013.01); *H01S 5/18386* (2013.01); *H01S 5/0234* (2021.01); *H01S 5/18305* (2013.01); *H01S 5/18311* (2013.01); *H01S 2301/18* (2013.01)

(58) Field of Classification Search

CPC . H01S 5/18302; H01S 5/18361–18366; H01S 2301/18; H01S 5/1021; H01S 5/1025; H01S 5/06233; H01S 5/06236; H01S 5/0624; H01S 5/06246; H01S 5/183–18397; H01S 5/02325; H01S 5/18386; H01S 5/18391

See application file for complete search history.

(56) References Cited

U.S. PATENT DOCUMENTS 5,608,568 A * 3/1997 Blodgett ............... G02F 1/0147 359/248
9,843,160 B1 * 12/2017 Schubert ............. H01S 5/06251
2005/0189473 A1 * 9/2005 Schrodinger ........... H10F 55/15 250/214.1

(Continued)

FOREIGN PATENT DOCUMENTS

CN 107611779 A 1/2018
CN 112993748 A 6/2021

OTHER PUBLICATIONS

Panajotov et al., "Vertical-cavity Surface-emitting Laser with Liquid Crystal Overlay," Optics Express, vol. 19, No. 18, pp. 16749-16759, Aug. 28, 2011.

(Continued)

*Primary Examiner* — Sean P Hagan
(74) *Attorney, Agent, or Firm* — Meitar Patents LTD.; Daniel Kligler

(57) ABSTRACT

An optoelectronic apparatus includes a semiconductor substrate, an electrically activated spatial light modulator disposed on the semiconductor substrate, and a vertical-cavity surface-emitting laser (VCSEL) disposed over the spatial light modulator on the semiconductor substrate. A controller is coupled to actuate the VCSEL to emit a beam of optical radiation and to control the spatial light modulator so as to modify an optical property of the beam.

18 Claims, 2 Drawing Sheets

(56) References Cited

U.S. PATENT DOCUMENTS

2015/0288146 A1* 10/2015 Chang-Hasnain .......................... H01S 5/18319 438/27
2017/0346257 A1* 11/2017 Garnache-Creuillot .................... H01S 5/18319
2018/0006426 A1* 1/2018 Takiguchi ......... G02F 1/133504
2018/0261977 A1* 9/2018 Feng ..................... H01S 5/1228

OTHER PUBLICATIONS

Shao et al., "Transverse-mode Control in VCSELs by Electrically Tunable Liquid Crystal Mode Filters," AIP Advances vol. 11, pp. 015225-015225-7, year 2021.
Xie et al., "Metasurface-integrated Vertical Cavity Surface-emitting Lasers for Programmable Directional Lasing Emissions," Nature Nanotechnology, vol. 15, pp. 1-38, Feb. 2020.

* cited by examiner 100
controller
108
106
124a
124b
116
118
112
121
128
114
110
102
122
104
105
105
105
120
126
109

Fig. 2A1
Fig. 2B1
Fig. 2C1
Fig. 2D1
Fig. 2A2
Fig. 2B2
Fig. 2C2
Fig. 2D2

DYNAMIC CONTROL OF LASER TRANSVERSE MODE

FIELD OF THE INVENTION

The present invention relates generally to optoelectronic devices, and particularly to emitters of optical radiation.

BACKGROUND

Vertical-cavity surface-emitting lasers (VCSELs) are widely used as sources of optical radiation both as single sources and as arrays of emitters. Their attributes include high optical power, narrow linewidth, and high efficiency, and they are advantageously used in applications such as optical communications and LiDAR (light detection and ranging).

SUMMARY

Embodiments of the present invention that are described hereinbelow provide improved methods and designs for controlling the emission of VCSELs.

There is therefore provided, in accordance with an embodiment of the invention, an optoelectronic apparatus, including a semiconductor substrate, an electrically activated spatial light modulator disposed on the semiconductor substrate, and a vertical-cavity surface-emitting laser (VCSEL) disposed over the spatial light modulator on the semiconductor substrate. A controller is coupled to actuate the VCSEL to emit a beam of optical radiation and to control the spatial light modulator so as to modify an optical property of the beam.

In a disclosed embodiment, the controller is configured to drive the spatial light modulator so as to select a transverse mode of the beam. Additionally or alternatively, the controller is configured to drive the spatial light modulator so as to switch the transverse mode of the beam among a plurality of different transverse modes.

In one embodiment, the controller is configured to drive the spatial light modulator to modify a polarization of the VCSEL.

In another embodiment, the controller is configured to drive the spatial light modulator to tune a wavelength of the VCSEL.

In a disclosed embodiment, the spatial light modulator includes a liquid crystal. Additionally or alternatively, the semiconductor substrate includes silicon, and the spatial light modulator includes a liquid crystal on silicon (LCoS) component. Further additionally or alternatively, the VCSEL includes an epitaxial stack on a die made of a III-V semiconductor material, which is mounted on the silicon substrate over the LCoS component. Additionally or alternatively, the die is mounted on the silicon substrate in a back-side emitting configuration.

In a further embodiment, the controller includes logic circuits disposed on the silicon substrate.

In a disclosed embodiment, the spatial light modulator includes a micro-electromechanical systems (MEMS) array.

In a further embodiment, the spatial light modulator includes a thermoelectrically tunable phase-change material.

In another embodiment, the spatial light modulator includes an array of pixels, and the controller is configured to drive the spatial light modulator to vary respective amplitudes of reflection coefficients of the pixels.

In yet another embodiment, the spatial light modulator includes an array of pixels, and the controller is configured to drive the spatial light modulator to vary respective phases of reflection coefficients of the pixels.

In a disclosed embodiment, the spatial light modulator is configured to function as a diffractive optical element.

In a further embodiment, the spatial light modulator is configured to function as a metasurface.

There is also provided, in accordance with an embodiment of the invention, a method for beam generation. The method includes providing a semiconductor substrate with an electrically activated spatial light modulator disposed on the semiconductor substrate, mounting a vertical-cavity surface-emitting laser (VCSEL) over the spatial light modulator on the semiconductor substrate, and actuating the VCSEL to emit a beam of optical radiation while controlling the spatial light modulator so as to modify an optical property of the beam.

The present invention will be more fully understood from the following detailed description of the embodiments thereof, taken together with the drawings in which:

BRIEF DESCRIPTION OF THE DRAWINGS

FIGS. 2A1 and 2A2, 2B1 and 2B2, 2C1 and 2C2, and 2D1 and 2D2 are schematic cross-sectional views of the modulation patterns of the SLM of the apparatus of FIG. 1, in accordance with embodiments of the invention.

DETAILED DESCRIPTION OF EMBODIMENTS

Overview

In a conventional VCSEL, the beam characteristics are determined by the design of the device and the semiconductor fabrication process by which the VCSEL is produced. Once the device has been fabricated, system integrators and users have little or no control over parameters of the emitted beam, such as transverse modes, divergence, wavelength, and polarization.

Embodiments of the present invention address these shortcomings by providing integrated optoelectronic devices that enable real-time control of the VCSEL beam parameters, particularly (but not only) the transverse modes of the emitted beam. In these embodiments, a VCSEL is mounted on a semiconductor substrate, such as a silicon substrate. An electrically controlled spatial light modulator (SLM), such as an LCoS (Liquid Crystal on Silicon) component, is disposed on the substrate directly under the VCSEL and is optically integrated with the optical cavity of the VCSEL. By controlling the pattern formed by the elements of the SLM while actuating the VCSEL, different transverse modes of the VCSEL output beam can be selected. Additionally or alternatively, the SLM pattern can be modulated to control other beam properties, such as rotating the polarization and/or to tuning the wavelength of the VCSEL.

The disclosed embodiments provide an optoelectronic apparatus, comprising a semiconductor substrate, an electrically activated spatial light modulator disposed on the semiconductor substrate, and a vertical-cavity surface-emitting laser (VCSEL) disposed over the spatial light modulator on the semiconductor substrate. A controller actuates the VCSEL to emit a beam of optical radiation and controls the spatial light modulator so as to select a transverse mode of the beam.

Optoelectronic Apparatus

Figure 1:
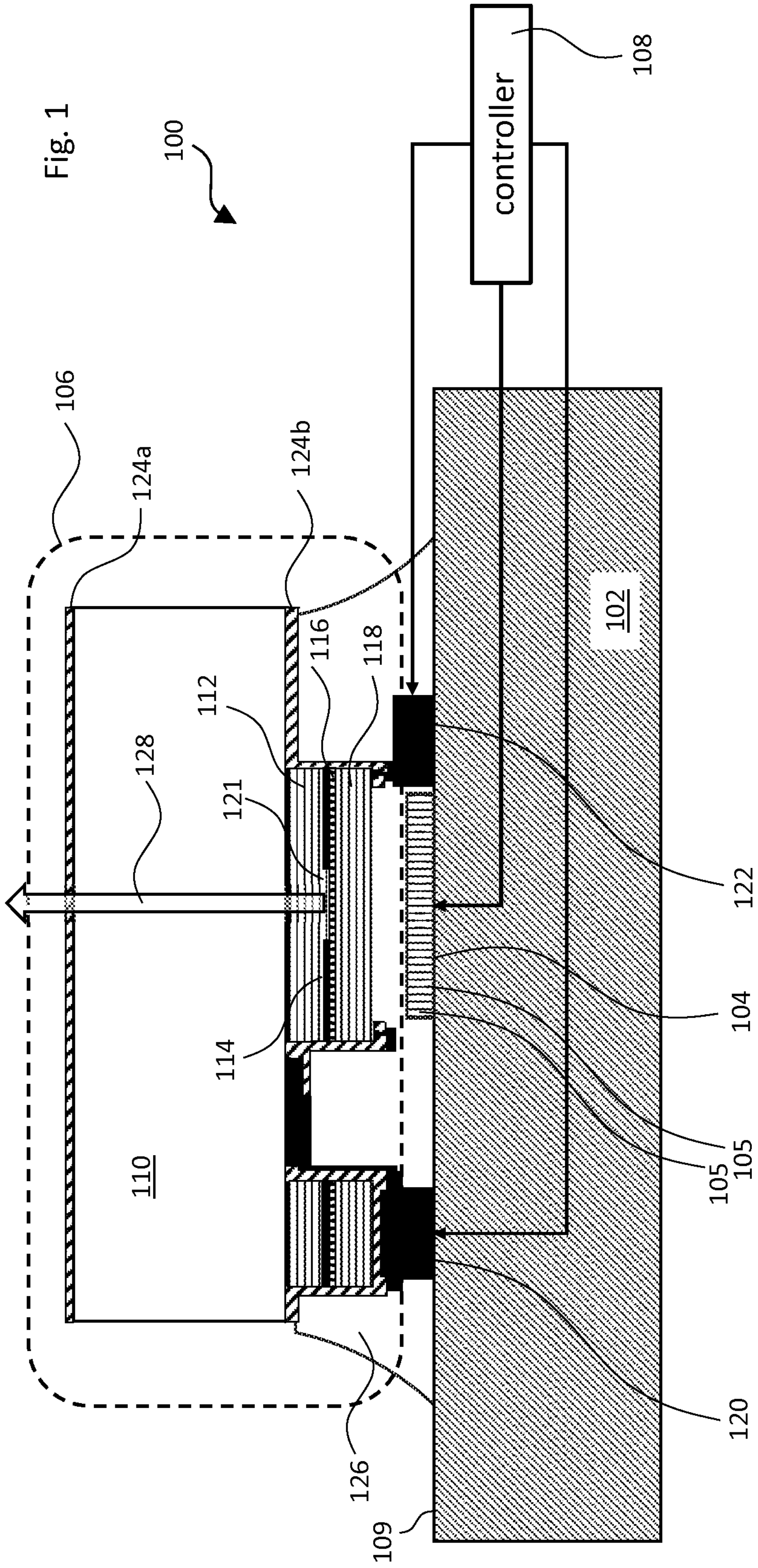
FIG. 1 is a schematic side view of an optoelectronic apparatus, in accordance with an embodiment of the invention.

FIG. 1 is a schematic side view of an optoelectronic apparatus 100, in accordance with an embodiment of the invention. Apparatus 100 comprises a silicon substrate 102, a spatial light modulator (SLM) 104 formed or otherwise mounted on the semiconductor substrate, and a vertical-cavity surface-emitting laser (VCSEL) 106 mounted over the SLM on the semiconductor substrate. Additionally or alternatively, VCSEL 106 may comprise an integrated spatial light modulator, for example in the form of an active metasurface. A controller 108, comprising electronic logic and drive circuits, is coupled to control SLM 104 and VCSEL 106. Although controller 108 is shown in FIG. 1, for the sake of clarity, as a separate block, it may conveniently be implemented on silicon substrate 102, for example in the form of CMOS circuits.

In the present embodiment, SLM 104 comprises an LCoS component with multiple pixels 105 arranged in a two-dimensional matrix over a top surface 109 of substrate 102. SLM 104 may comprise any suitable type of electrooptic material, such as a nematic liquid crystal or a cholesteric liquid crystal, possibly with a polymer additive. Each pixel 105 is controlled by controller 108 via a corresponding microelectrode (not shown). By changing the voltage on the corresponding microelectrode, controller 108 is able to modulate both the amplitude and the phase of the reflection coefficient (the ratio of the reflected to incident electric field) of each pixel between the values of 0 and 1 and of 0 and 2π, respectively. By appropriate choice of the driving voltages, controller is able to drive SLM 104 to function as a mirror of variable size and shape or as a metasurface or other type of diffractive optical element.

In alternative embodiments, SLM 104 may comprise other sorts of optical modulators. For example, in one embodiment, SLM 104 comprises a micro-electromechanical systems (MEMS) device, such as an array of controllable micromirrors. In another embodiment, SLM 104 comprises a thermoelectrically tunable phase-change material, such as vanadium dioxide ($VO_2$), driven by controller 108.

VCSEL 106 comprises a III-V semiconductor die 110, such as a gallium-arsenide (GaAs) die, on which a stack of epitaxial layers has been deposited and patterned. These layers define an upper distributed Bragg reflector (DBR) 112, an oxide confinement layer 114, an active region 116, and a lower DBR 118. (The terms "upper" and "lower" reflect the respective locations of DBRs 112 and 118 in apparatus 100, in which die 110 has been flipped upside down after fabrication of VCSEL 106. During fabrication, DBR 112 is deposited first on a III-V semiconductor substrate and is then overlaid by the other layers.) Active region 116 comprises one or more quantum wells, and oxide layer 114 is etched to define an aperture 121 of VCSEL 106. VCSEL 106 is isolated on its upper and lower sides by passivation layers 124*a* and 124*b*.

DBRs 112 and 118 together form the laser cavity of VCSEL 106. After fabrication of VCSELs 106 on the III-V substrate, the substrate is thinned and diced, and the VCSEL die is mounted on substrate 102 over SLM 104 in a "back-side emission" configuration. In this configuration, VCSEL 106 emits optical radiation as a beam 128 passing upward through DBR 112 and die 110. (Alternatively, VCSEL may be configured, mutatis mutandis, for front-side emission through DBR 118, with GaAs substrate adjoining SLM 104.) Anode and cathode electrodes 120 and 122 couple the driving current from controller 108 to active region 116 for generating emission of optical radiation. The active components of VCSEL 106 and its connections to silicon substrate 102 are encapsulated in an adhesive 126.

Lower DBR 118 is partially transmitting so that SLM 104 contributes to the overall reflectance of the lower DBR and thus is able to influence the transverse mode structure of VCSEL 106. Additionally or alternatively, the phase pattern applied by SLM 104 may be adjusted to control the polarization and/or to tune the wavelength of the VCSEL.

In addition to the logic and drive circuits mentioned above, controller 108 may also comprise a programmable processor, which is programmed in software and/or firmware to control SLM 104, as well as actuating VCSEL 106. Although controller 108 is shown in the figures, for the sake of simplicity, as a single, monolithic functional block, in practice the controller may comprise multiple circuits and interfaces, as will be apparent to those skilled in the art.

Control of Transverse Modes

FIGS. 2A1 and 2A2, 2B1 and 2B2, 2C1 and 2C2, and 2D1 and 2D2 are schematic cross-sectional views of modulation patterns of SLM 104 in apparatus 100 (FIG. 1), in accordance with embodiments of the invention.

Each of FIGS. 2A1, 2B1, 2C1, and 2D1 shows a cross-sectional view of the spatial distribution of the amplitude of the respective reflection coefficient of SLM 104; while each of FIGS. 2A2, 2B2, 2C2, and 2D2 shows a cross-sectional view of the spatial distribution of the phase of the respective reflection coefficient of SLM 104. Thus, a view 202*a* in FIG. 2A1 indicates the amplitude of the reflection coefficient, with white indicating a high value, black a low value, and shades of gray an intermediate value. Similarly in FIG. 2A2, a view 204*a* indicates the phase of the reflection coefficient, which in this case in constant (meaning that SLM 104 modulates only the amplitude of the VCSEL beam). Similarly, FIGS. 2B1 and 2B2, 2C1 and 2C2, and 2D1 and 2D2 show respective reflection coefficient amplitudes and phases in views 202*b*/204*b*, 202*c*/204*c*, and 202*d*/204*d*. The gray scale in views 204*c* and 204*d* represents the phase variation in over the area of the SLM over a range from −2π to +2π.

Views 204*a* and 204*b* show a constant phase across SLM 104. View 204*c* shows a phase that changes linearly from −2π to +2π with a rotation angle θ around the center of SLM 104. View 204*d* shows a phase that changes linearly twice from −2π to +2π with a rotation angle θ, i.e., with two full rotations around the center of SLM 104. The behavior of the phase in views 204*c* and 204*d* is termed a vortex-like behavior.

In additional embodiments, other spatial distributions of the amplitude and phase of the reflection coefficient of SLM 104 may be implemented.

FIGS. 3A, 3B, 3C, and 3D are schematic cross-sectional views of transverse modes of beam 128 emitted by apparatus 100 in response to the modulation patterns of SLM 104 of FIGS. 2A-2D.

The amplitudes of the transverse modes of beam 128 are indicated in FIGS. 3A-3D in respective views 302*a*-302*d* in a reverse grayscale, i.e., dark grey indicates a high amplitude, whereas light gray indicates a low amplitude.

Figures 3A, 3B, 3C, 3D:
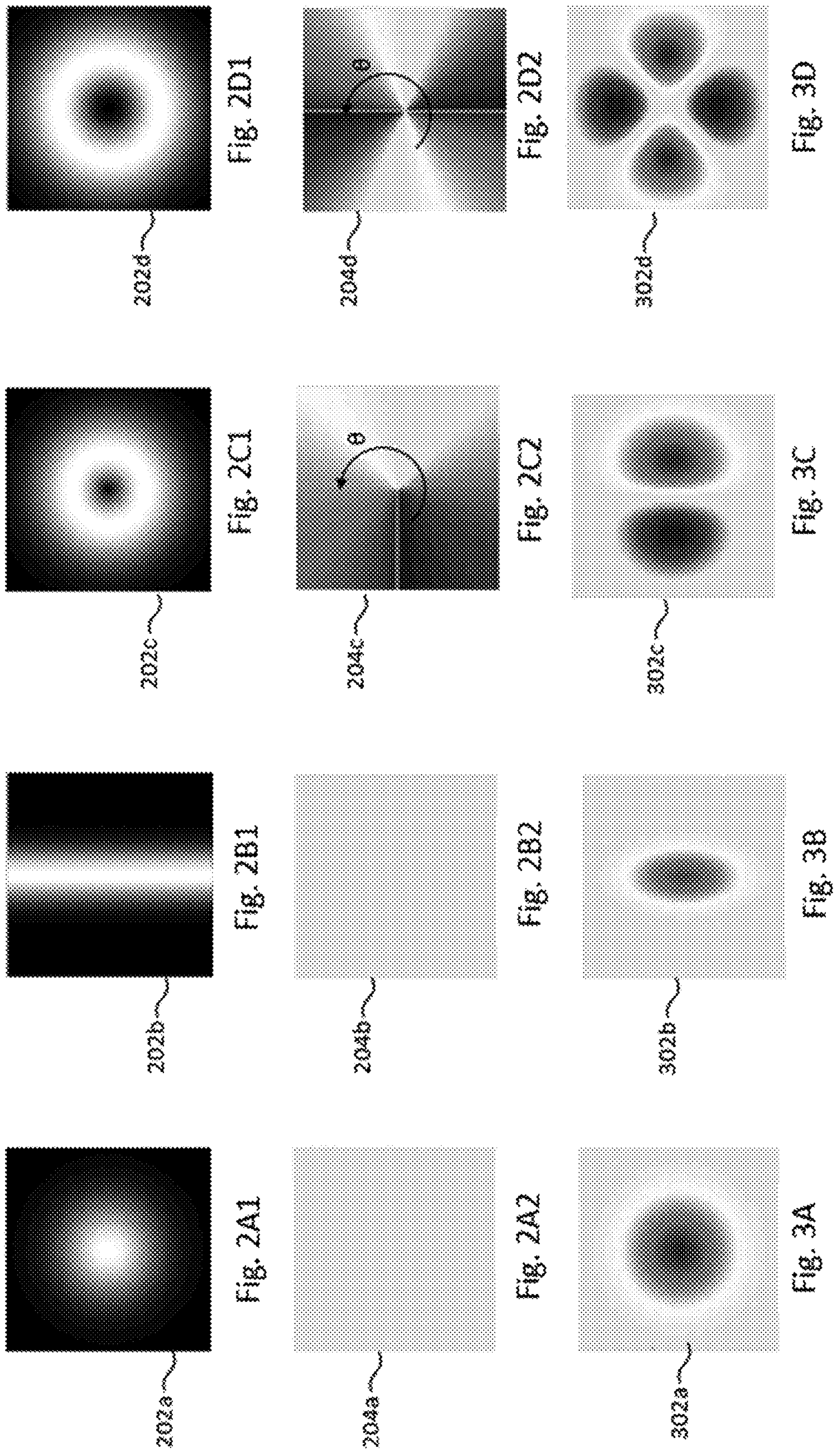
FIGS. 3A, 3B, 3C, and 3D are schematic cross-sectional views of transverse modes of the beam emitted by the apparatus of FIG. 1 in response to the modulation patterns of the SLM shown in FIGS. 2A-2D, in accordance with embodiments of the invention.

View 302*a* in FIG. 3A shows a circularly symmetrical transverse mode due to the circularly symmetrical amplitude and constant phase of the reflection coefficient of SLM 104, shown in views 202*a* and 204*a* (FIG. 2A). View 302*b* in FIG. 3B shows an elongated transverse mode due to a slit-like amplitude and constant phase of the reflection coefficient of SLM 104, shown in views 202*b* and 204*b* (FIG. 2B). View 302*c* in FIG. 3C shows a two-lobed transverse mode due to a combination of an annular amplitude and a vortex-like phase of the reflection coefficient of SLM 104, shown in views 202*c* and 204*c* (FIG. 2C). View 302*d* in FIG. 3D shows a four-lobed transverse mode due to a combination of an annular amplitude and a twice-rotated vortex-like phase of the reflection coefficient of SLM 104, shown in views 202*d* and 204*d* (FIG. 2D).

These particular modulation patterns and the corresponding beam modes are shown by way of example. The addressable amplitude and phase modulation of SLM 104 make it possible to generate a wide variety of other beam patterns, depending on application requirements.

In alternative embodiments, the polarization state or a combination of the intensity and the polarization state of the transverse mode of beam 128 may be selected by a suitable selection of amplitude/phase modulation pattern of pixels 105 of SLM 104. Additionally or alternatively, the phases of pixels 105 may be modulated in order to tune the emission wavelength of VCSEL 106 over a certain range.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optoelectronic apparatus, comprising:

a semiconductor substrate;

an electrically activated spatial light modulator disposed on the semiconductor substrate;

a vertical-cavity surface-emitting laser (VCSEL) disposed over the spatial light modulator on the semiconductor substrate and comprising an upper distributed Bragg reflector and a lower distributed Bragg reflector, wherein the spatial light modulator is optically integrated with an optical cavity of the VCSEL and contributes to an overall reflectance of the lower distributed Bragg reflector; and a controller coupled to actuate the VCSEL to emit a beam of optical radiation and to control the spatial light modulator so as to modify an optical property of the beam, wherein the controller is configured to drive the spatial light modulator to reflect the beam with a reflection coefficient having an annular amplitude and a vortex-like phase over an area of the spatial light modulator so as to select a transverse mode of the beam having multiple lobes.

2. The apparatus according to claim 1, wherein the controller is configured to drive the spatial light modulator so as to switch the transverse mode of the beam among a plurality of different transverse modes.

3. The apparatus according to claim 1, wherein the controller is configured to drive the spatial light modulator to modify a polarization of the VCSEL.

4. The apparatus according to claim 1, wherein the controller is configured to drive the spatial light modulator to tune a wavelength of the VCSEL.

5. The apparatus according to claim 1, wherein the spatial light modulator comprises a liquid crystal.

6. The apparatus according to claim 5, wherein the semiconductor substrate comprises silicon, and the spatial light modulator comprises a liquid crystal on silicon (LCoS) component.

7. The apparatus according to claim 6, wherein VCSEL comprises an epitaxial stack on a die made of a III-V semiconductor material, which is mounted on the semiconductor substrate over the LCOS component.

8. The apparatus according to claim 7, wherein the die is mounted on the silicon substrate in a back-side emitting configuration.

9. The apparatus according to claim 7, wherein the controller comprises logic circuits disposed on the silicon substrate.

10. The apparatus according to claim 1, wherein the spatial light modulator comprises a micro-electromechanical systems (MEMS) array.

11. The apparatus according to claim 1, wherein the spatial light modulator comprises a thermoelectrically tunable phase-change material.

12. The apparatus according to claim 1, wherein the spatial light modulator comprises an array of pixels, and wherein the controller is configured to drive the spatial light modulator to vary respective amplitudes of reflection coefficients of the pixels.

13. The apparatus according to claim 1, wherein the spatial light modulator comprises an array of pixels, and wherein the controller is configured to drive the spatial light modulator to vary respective phases of reflection coefficients of the pixels.

14. The apparatus according to claim 1, wherein the spatial light modulator is configured to function as a diffractive optical element.

15. The apparatus according to claim 1, wherein the spatial light modulator is configured to function as a metasurface.

16. A method for beam generation, comprising:

providing a semiconductor substrate with an electrically activated spatial light modulator disposed on the semiconductor substrate;

mounting a vertical-cavity surface-emitting laser (VCSEL) over the spatial light modulator on the semiconductor substrate, wherein the spatial light modulator is optically integrated with an optical cavity of the VCSEL and contributes to an overall reflectance of a lower distributed Bragg reflector of the VCSEL; and actuating the VCSEL to emit a beam of optical radiation while controlling the spatial light modulator so as to modify an optical property of the beam, wherein controlling the spatial light modulator comprises driving the spatial light modulator to reflect the beam with a reflection coefficient having an annular amplitude and a vortex-like phase over an area of the spatial light modulator so as to select a transverse mode of the beam having multiple lobes.

17. The method according to claim 16, wherein controlling the spatial light modulator comprises driving the spatial light modulator so as to switch a transverse mode of the beam among a plurality of different transverse modes.

18. The method according to claim 16, wherein controlling the spatial light modulator comprises driving the spatial light modulator to tune a wavelength of the VCSEL.

* * * * *